United States Patent
Mori et al.

(10) Patent No.: US 9,250,534 B2
(45) Date of Patent: Feb. 2, 2016

(54) NONAQUEOUS CLEANING LIQUID AND METHOD FOR ETCHING PROCESSING OF SILICON SUBSTRATE

(71) Applicant: Tokyo Ohka Kogyo Co., Ltd., Kawasaki-shi (JP)

(72) Inventors: Daijiro Mori, Kawasaki (JP); Takayuki Haraguchi, Kawasaki (JP)

(73) Assignee: TOKYO OHKA KOGYO CO., LTD., Kawasaki-Shi (JP)

( * ) Notice: Subject to any disclaimer, the term of this patent is extended or adjusted under 35 U.S.C. 154(b) by 0 days.

(21) Appl. No.: 13/939,549

(22) Filed: Jul. 11, 2013

(65) Prior Publication Data
US 2014/0017902 A1  Jan. 16, 2014

(30) Foreign Application Priority Data

Jul. 13, 2012 (JP) ................. 2012-157970

(51) Int. Cl.
| | | |
|---|---|---|
| *G03F 7/42* | (2006.01) | |
| *H01L 21/32* | (2006.01) | |
| *H01L 21/306* | (2006.01) | |
| *H01L 21/321* | (2006.01) | |
| *H01L 21/02* | (2006.01) | |
| *H01L 21/3065* | (2006.01) | |
| *H01L 21/311* | (2006.01) | |

(Continued)

(52) U.S. Cl.
CPC ............ *G03F 7/426* (2013.01); *B81C 1/00849* (2013.01); *C11D 7/06* (2013.01); *C11D 7/28* (2013.01); *C11D 7/3209* (2013.01); *C11D 7/5022* (2013.01); *C11D 11/0047* (2013.01); *G03F 7/425* (2013.01); *H01L 21/02057* (2013.01); *H01L 21/30604* (2013.01); *H01L 21/30655* (2013.01); *H01L 21/31133* (2013.01); *H01L 21/3212* (2013.01); *H01L 21/76898* (2013.01); *C11D 7/261* (2013.01); *C11D 7/3281* (2013.01); *C11D 7/34* (2013.01)

(58) Field of Classification Search
None
See application file for complete search history.

(56) References Cited

U.S. PATENT DOCUMENTS 4,234,504 A * 11/1980 Hallgren et al. ............... 558/260
6,048,910 A *  4/2000 Furuya et al. .................. 522/86

(Continued)

FOREIGN PATENT DOCUMENTS

| JP | 11244705 A * | 9/1999 |
| JP | A-2012-023339 | 2/2012 |
| WO | WO 2011090734 A1 * | 7/2011 |

OTHER PUBLICATIONS

Esashi, "Electronic Journal, 98th Technical Seminar, Foundation and Application of MEMS, Through Explanation", pp. 44 to 45, [online], Electronic Journal Co., Search Jun. 13, 2012, Internet (URL: http://www.electronicjournal.co.jp/pdf/t_seminer/t098/01.pdf).

*Primary Examiner* — Shamim Ahmed
*Assistant Examiner* — Bradford Gates
(74) *Attorney, Agent, or Firm* — Knobbe Martens Olson & Bear LLP

(57) ABSTRACT

A nonaqueous cleaning liquid comprising a fluoroalkanol, a quaternary ammonium hydroxide, and an organic solvent. Compounds represented by formulae (1) and (2). Fluoroalkanol compounds include (1) $H(CF_2)_aCH_2$—OH and (2) $F(CF_2)_b(CH_2)_c$—OH In which a and b are each an integer of from 2 to 6, and c is an integer of 1 or 2.

14 Claims, 1 Drawing Sheet

(51) Int. Cl.
*C11D 7/06* (2006.01)
*C11D 7/28* (2006.01)
*C11D 7/32* (2006.01)
*C11D 7/50* (2006.01)
*C11D 11/00* (2006.01)
*H01L 21/768* (2006.01)
*B81C 1/00* (2006.01)
*C11D 7/26* (2006.01)
*C11D 7/34* (2006.01)

(56) References Cited

U.S. PATENT DOCUMENTS

2001/0031850 A1* 10/2001 Mohri et al. .................... 528/42
2010/0168304 A1* 7/2010 Nagato et al. ................. 524/263

* cited by examiner

NONAQUEOUS CLEANING LIQUID AND METHOD FOR ETCHING PROCESSING OF SILICON SUBSTRATE

This application claims priority to Japanese Patent Application No. 2012-157970, filed on Jul. 13, 2012, the entire content of which is incorporated herein by reference.

BACKGROUND OF THE INVENTION

1. Field of the Invention

The present invention relates to a nonaqueous cleaning liquid that is suitably used in a method for etching processing of a silicon substrate by the BOSCH method, and a method for processing a silicon substrate using the nonaqueous cleaning liquid.

2. Related Art

In, for example, a process for processing a MEMS (Micro Electro Mechanical System), a process for processing a through-silicon via (TSV), and the like, it may be necessary to deeply excavate a silicon substrate by etching. In this case, an etching process called the BOSCH method is often employed because it is easy to control the etching rate and the aspect ratio of the hole formed by etching.

The BOSCH method is a method for progressively excavating a silicon substrate while forming a fluorocarbon layer with a fluorocarbon gas on the inner surface of a portion excavated by etching. Accordingly, a fluorocarbon layer is deposited on the inner surface of the hole formed in the silicon substrate. Therefore, when the hole is formed in a silicon substrate by the BOSCH method, it is necessary to eventually remove the fluorocarbon layer deposited on the inner surface of the hole.

Thus, several methods have been proposed for removing the fluorocarbon layer deposited on the inner surface of the hole formed by the BOSCH method. Examples of the specific method include a method in which the fluorocarbon layer is cleaned off using ethyl perfluorobutyl ether (HFE-7200, manufactured by Sumitomo 3M Limited) as a special chemical liquid (Non-Patent Document 1) and a method in which the fluorocarbon layer is cleaned off with a mixed liquid of aqueous hydrogen peroxide, a basic chemical liquid such as tetramethylammonium hydroxide and water (Patent Document 1).

Patent Document 1: Japanese Unexamined Patent Application, Publication No. 2012-023339

Non-Patent Document 1: Masaki Esashi, "Electronic Journal, 98$^{th}$ Technical Seminar, Foundation and Application of MEMS, Through Explanation", pages 44 to 45, [online], Electronic Journal Co., [Search Jun. 13, 2012], Internet (URL: http://www.electronicjournal.co.jp/pdf/t_seminer/t098/01.pdf)

SUMMARY OF THE INVENTION

However, the cleaning liquid described in Non-Patent Document 1 has very high volatility, and improvements against volatility are desired when it is used in the cleaning process. In the processing process of a MEMS or a TSV, portions of a silicon substrate other than those that are deeply etched are also subjected to processing, and therefore if resist material can be removed with a cleaning liquid for removing a fluorocarbon layer in a hole formed by the BOSCH method, a major advantage is provided in terms of a process. However the cleaning liquid described in Non-Patent Document 1 is poor in resist material removal performance.

The cleaning liquid described in Patent Document 1 also has the problem that it is difficult to remove a resist material, particularly a negative resist material although a fluorocarbon layer can be removed.

The present invention has been made in view of the above-described problem, and an object thereof is to provide a cleaning liquid which is capable of removing both a fluorocarbon layer and a resist material and in which the volatility loss of the cleaning liquid component when the cleaning liquid is used in a cleaning process is suppressed. Also, an object of the present invention is to provide a method for etching processing of a silicon substrate by the BOSCH method using the cleaning liquid.

The present inventors have found that by compounding a fluoroalkanol and a quaternary ammonium hydroxide as necessary with a nonaqueous cleaning liquid, the above-described problem can be solved, leading to fulfillment of the present invention. Specifically, the present invention provides the following.

A first aspect of the present invention is a nonaqueous cleaning liquid including: (A) a fluoroalkanol; (B) a quaternary ammonium hydroxide; and ($C^1$) an organic solvent.

A second aspect of the present invention is a nonaqueous cleaning liquid including: (A) a fluoroalkanol; and ($C^2$) an organic solvent, wherein the ($C^2$) organic solvent is a non-amine-based organic solvent which does not contain a fluorine atom.

A third aspect of the present invention is a method for etching processing of a silicon substrate, and the method includes:

(A-I) an etching mask layer forming step of forming an etching mask layer having a predetermined pattern on the surface of a silicon substrate;

(A-II) a first etching step of etching the surface of the substrate uncovered by the etching mask layer;

(A-III) a recessed portion forming step of forming a recessed portion having a predetermined depth in the silicon substrate by repeating the steps (i) and (ii) a predetermined number of times:

(i) a fluorocarbon layer forming step of forming a fluorocarbon layer on a side wall and the bottom face of a recessed portion on the substrate surface, which is formed by etching, and (ii) a second etching step of etching the bottom face of the recessed portion; and (A-IV) a fluorocarbon layer removing step of removing the fluorocarbon layer with a cleaning liquid after forming the recessed portion having a predetermined depth.

In the fluorocarbon layer removing step, the nonaqueous cleaning liquid of the first aspect or the second aspect is used for removing the fluorocarbon layer.

A fourth aspect of the present invention is a method for etching processing of a silicon substrate, and the method includes:

(B-I) a resist film forming step of forming a resist film by applying a resist composition to the surface of a silicon substrate;

(B-II) an etching mask layer forming step of forming an etching mask layer having predetermined pattern by exposing and developing the resist film;

(B-III) a first etching step of etching the surface of the substrate uncovered by the etching mask layer;

(B-IV) a recessed portion forming step of forming a recessed portion having a predetermined depth in the silicon substrate by repeating the steps (i) and (ii) a predetermined number of times:

(i) a fluorocarbon layer forming step of forming a fluorocarbon layer on the side wall of the recessed portion on the substrate surface, which is formed by etching, and (ii) a second etching step of etching the bottom face of the recessed portion;

(B-V) an etching mask layer removing step of removing the etching mask layer with a cleaning liquid after forming the recessed portion having a predetermined depth; and (B-VI) a fluorocarbon layer removing step of removing the fluorocarbon layer with a cleaning liquid after forming the recessed portion having a predetermined depth.

The nonaqueous cleaning liquid of the first aspect or the second aspect is used for removing the etching mask layer and/or the fluorocarbon layer.

A fifth aspect of the present invention is a method for etching processing of a silicon substrate, and the method includes:

(C-I) an inorganic silicon compound film forming step of forming an inorganic silicon compound film on the surface of a silicon substrate;

(C-II) a resist film forming step of forming a resist film by applying a resist composition onto the inorganic silicon compound film;

(C-III) a resist pattern forming step of forming a resist pattern of a predetermined pattern by exposing and developing the resist film;

(C-IV) an etching mask layer forming step of forming an etching mask layer having a predetermined pattern and composed of a silicon compound by etching a portion of the surface of the inorganic silicon compound film on which is uncovered by the resist pattern, and thereafter removing the resist pattern with a cleaning liquid;

(C-V) a first etching step of etching the surface of the substrate uncovered by the etching mask layer;

(C-VI) a recessed portion forming step of forming a recessed portion having a predetermined depth in the silicon substrate by repeating the steps (i) and (ii) a predetermined number of times:

(i) a fluorocarbon layer forming step of forming a fluorocarbon layer on the side wall of a recessed portion on the substrate surface, which is formed by etching, and (ii) a second etching step of etching the bottom face of the recessed portion; and (C-VII) a fluorocarbon layer removing step of removing the fluorocarbon layer with a cleaning liquid after forming the recessed portion having a predetermined depth.

The nonaqueous cleaning liquid of the first aspect or the second aspect is used for removing the resist pattern and/or the fluorocarbon layer.

According to the present invention, a cleaning liquid can be provided which is capable of removing both a fluorocarbon layer and a resist material and in which the volatility loss of the cleaning liquid component when the cleaning liquid is used in the cleaning process is suppressed. According to the present invention, a method for etching processing of a silicon substrate using the cleaning liquid can also be provided.

DETAILED DESCRIPTION OF THE INVENTION

Figure 1A:
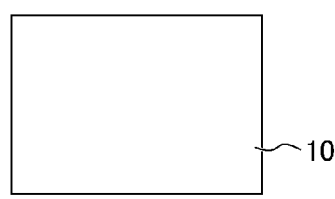
FIG. 1A is a view illustrating a silicon substrate before being subjected to etching processing.

Nonaqueous Cleaning Liquid According to First Aspect

Hereinafter, a nonaqueous cleaning liquid according to a first aspect of the present invention will be described. The nonaqueous cleaning liquid according to the first aspect includes (A) a fluoroalkanol, (B) a quaternary ammonium hydroxide and ($C^1$) an organic solvent. Hereinafter, the (A) fluoroalkanol, the (B) quaternary ammonium hydroxide, the ($C^1$) organic solvent, (D) other components, and a method for production of a nonaqueous cleaning liquid will be described in order.

(A) Fluoroalkanol

A nonaqueous cleaning liquid according to a first aspect contains (A) a fluoroalkanol (hereinafter, also referred to as component (A)) in which at least one of the hydrogen atoms bonded to carbon in alkanol is substituted with a fluorine atom.

The structure of the (A) fluoroalkanol is not particularly limited unless the object of the present invention is hindered, and the structure may be any of a straight chain structure, a branched chain structure, a ring structure and a combination of these structures. The structure of the (A) fluoroalkanol is preferably a straight chain structure because of easy acquisition and excellent fluorocarbon layer removal performance of the cleaning liquid.

The number of hydroxyl groups of the (A) fluoroalkanol is not particularly limited unless the object of the present invention is hindered. The (A) fluoroalkanol is preferably a fluoroalkanemonool or a fluoroalkanediol, more preferably a fluoroalkanemonool.

The number of carbon atoms of the (A) fluoroalkanol is not particularly limited unless the object of the present invention is hindered. The number of carbon atoms of the (A) fluoroalkanol is preferably 3 to 20, more preferably 3 to 12, especially preferably 3 to 8.

The fluoroalkanol contains a fluorine-substituted mono- or higher valent hydrocarbon group. The substitution ratio with fluorine atoms in a fluorine-substituted hydrocarbon group contained in the fluoroalkanol is not particularly limited unless the object of the present invention is hindered, but is preferably 50% or more.

Among the components (A) described above, a compound represented by the following formula (1) or formula (2) is preferred:

$$H(CF_2)_a CH_2-OH \quad (1)$$

$$F(CF_2)_b(CH_2)_c-OH \quad (2)$$

(in the formulae (1) and (2), a and b are each an integer of from 2 to 6, and c is an integer, 1 or 2).

Preferred specific examples of the compound represented by the above formula (1) include compounds of the following formulae (1-1) to (1-3).

$$H(CF_2)_2 CH_2-OH \quad (1-1)$$

$$H(CF_2)_4 CH_2-OH \quad (1-2)$$

$$H(CF_2)_6 CH_2-OH \quad (1-3)$$

Preferred specific examples of the compound represented by the above formula (2) include compounds of the following formulae (2-1) and (2-2).

$$F(CF_2)_2(CH_2)_1-OH \quad (2-1)$$

$$F(CF_2)_4(CH_2)_2-OH \quad (2-1)$$

The fluoroalkanols described above may be used in combination of two or more thereof. The content of the component (A) in the nonaqueous cleaning liquid according to the first aspect is not particularly limited as long as the nonaqueous cleaning liquid in which components are uniformly dissolved can be prepared. The content of the component (A) in the nonaqueous cleaning liquid according to the first aspect is preferably 0.1 to 50% by mass, more preferably 0.5 to 10% by mass based on the mass of the nonaqueous cleaning liquid.

(B) Quaternary Ammonium Hydroxide

The nonaqueous cleaning liquid according to the first aspect contains (B) a quaternary ammonium hydroxide (hereinafter, also referred to as a component (B)). The (B) quaternary ammonium hydroxide is not particularly limited unless the object of the present invention is hindered. The (B) quaternary ammonium hydroxide can be appropriately selected from those that have been used heretofore for cleaning liquids used in methods for processing various substrates using a resist material and methods for the processing of substrates by etching.

Examples of the preferred (B) quaternary ammonium hydroxide include compounds represented by the following formula (3).

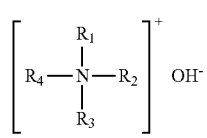

$$\begin{bmatrix} R_1 \\ | \\ R_4-N-R_2 \\ | \\ R_3 \end{bmatrix}^+ OH^- \quad (3)$$

(In the above formula (3), $R_1$ to $R_4$ each independently represent an alkyl group or hydroxyalkyl group having 1 to 4 carbon atoms.)

Among the compounds represented by the above formula (3), tetramethylammonium hydroxide, tetraethylammonium hydroxide, tetrapropylammonium hydroxide, tetrabutylammonium hydroxide, methyltripropylammonium hydroxide, methyltributylammonium hydroxide and (2-hydroxtethyl) trimethylammonium hydroxide are preferred because of easy acquisition. Furthermore, tetramethylammonium hydroxide and tetraethylammonium hydroxide are especially preferred because a nonaqueous cleaning liquid capable of properly cleaning the resist material or fluorocarbon is easily obtained.

The content of the component (B) in the nonaqueous cleaning liquid according to the first aspect is not particularly limited as long as the nonaqueous cleaning liquid in which components are uniformly dissolved can be prepared. The content of the component (B) in the nonaqueous cleaning liquid according to the first aspect is preferably 0.5 to 10% by mass, more preferably 1 to 5% by mass, furthermore preferably 1 to 3% by mass based on the mass of the nonaqueous cleaning liquid.

($C^1$) Organic Solvent

The nonaqueous cleaning liquid according to the first aspect contains a ($C^1$) organic solvent (hereinafter, referred to as a ($C^1$) component). The ($C^1$) organic solvent is not particularly limited unless the object of the present invention is hindered. The ($C^1$) organic solvent can be appropriately selected from those that have been used heretofore for nonaqueous cleaning liquids used in methods for processing various substrates using a resist material and methods for processing substrates by etching. Glycols, glycol ethers and aprotic polar organic solvents are preferred as the ($C^1$) organic solvent.

Ethylene glycol, diethylene glycol and propylene glycol are preferred as glycols. Ethylene glycol ethers, diethylene glycol ethers and propylene glycol ether are preferred as glycol ethers. Alkyl ethers of glycols are preferred, alkyl ethers of 1 to 6 carbon atoms of glycols are more preferred, and alkyl ethers of 1 to 4 carbon atoms of glycol ethers are especially preferred as glycol ethers.

Preferred examples of glycols and glycol ethers include ethylene glycol, ethylene glycol monomethyl ether, ethylene glycol monoethyl ether, ethylene glycol monobutyl ether, ethylene glycol monomethyl ether acetate, ethylene glycol monoethyl ether acetate, diethylene glycol, diethylene glycol monomethyl ether, diethylene glycol monoethyl ether, diethylene glycol monopropyl ether, diethylene glycol monobutyl ether and propylene glycol. Among them, ethylene glycol, propylene glycol and diethylene glycol monobutyl ether are more preferred.

Preferred examples of the aprotic polar organic solvent include sulfoxides such as dimethyl sulfoxide; sulfones such as dimethyl sulfone, diethyl sulfone, bis(2-hydroxyethyl)sulfone and tetramethylene sulfone; amides such as N,N-dimethylformamide, N-methylformamide, N,N-dimethylacetamide, N-methylacetamide and N,N-diethylacetamide; lactams such as N-methyl-2-pyrrolidone, N-ethyl-2-pyrrolidone, N-propyl-2-pyrrolidone, N-hydroxymethyl-2-pyrrolidone and N-hydroxyethyl-2-pyrrolidone; and imidazolidinones such as 1,3-dimethyl-2-imidazolidinone, 1,3-diethyl-2-imidazolidinone and 1,3-diisopropyl-2-imidazolidinone. Among them, dimethyl sulfoxide, sulfolane, N-methyl-2-pyrrolidone and N-ethyl-2-pyrrolidone are more preferred.

The ($C^1$) organic solvents may be used in a combination of two or more thereof. When two or more ($C^1$) organic solvents are used, it is preferred that an organic solvent selected from glycols and glycol ethers and an aprotic polar organic solvent are used in combination.

(D) Other Components

The nonaqueous cleaning liquid according to the first aspect may contain other components (hereinafter, also referred to as a component (D)) such as a surfactant and an anticorrosive agent unless the object of the invention of the present application is hindered. The type of the surfactant is not particularly limited. Examples of the preferred surfactant include amine-based activators substituted with an alkyl group or oxyalkyl group having at least 10 carbon atoms, acetylene alcohol-based activators, and diphenyl ether-based activators substituted with at least one alkyl group having 7 or more carbon atoms.

The anticorrosive agent is used for suppressing corrosion of a metal material, such as copper, by the nonaqueous cleaning liquid formed on a silicon substrate. Preferred examples of the anticorrosive agent include aromatic hydroxyl compounds (e.g. pyrocatechol, tert-butylcatechol, pyrogallol, gallic acid, etc.), triazole-based compounds (e.g. benzotriazole, etc.), mercapto group-containing compounds and sugar alcohols (e.g. xylitol, sorbitol, etc.). Among them, mercapto group-containing compounds are preferred from the viewpoint of the effect of preventing corrosion of a metal or the like. As mercapto group-containing compounds, compounds represented by the following formulae (4) and (5) are preferred.

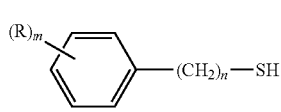
(4)

In the formula (4), R represents a group selected from the group consisting of a hydroxyl group, an alkyl group having 1 to 4 carbon atoms, an alkoxy group having 1 to 4 carbon atoms, an alkylthio group having 1 to 4 carbon atoms, a hydroxyalkyl group having 1 to 4 carbon atoms, a mercaptoalkyl group having 1 to 4 carbon atoms, a halogenated alkyl group having 1 to 4 carbon atoms and a halogen atom; m is an integer of 1 to 3; and n is an integer of 0 to 3, wherein provided that m is 2 or 3, R may be the same or different.

(5)

In the formula (5), x is an integer of no less than 3.

Specific examples of the case in which R represents an alkyl group having 1 to 4 carbon atoms which may have a hydroxyl group in the formula (4) include a methyl group, an ethyl group, a n-propyl group, an iso-propyl group, a n-butyl group, an iso-butyl group, a sec-butyl group, and a tert-butyl group. Among these alkyl groups, a methyl group, a hydroxymethyl group or an ethyl group is preferred since suitable solubility in the ($C^1$) organic solvent can be attained, and a methyl group or a hydroxymethyl group is more preferred since the anticorrosive effect is further improved.

Specific examples of the case in which R represents an alkoxy group having 1 to 4 carbon atoms in the formula (4) include a methoxy group, an ethoxy group, a n-propyloxy group, an iso-propyloxy group, a n-butyloxy group, an iso-butyloxy group, a sec-butyloxy group, and a tert-butyloxy group. Among these alkoxy groups, a methoxy group or an ethoxy group is preferred since suitable solubility in the ($C^1$) organic solvent can be attained, and a methoxy group is more preferred since the anticorrosive effect is further improved.

Specific examples of the case in which R represents an alkylthio group having 1 to 4 carbon atoms in the formula (4) include a methylthio group, an ethylthio group, a n-propylthio group, an iso-propylthio group, a n-butylthio group, an iso-butylthio group, a sec-butylthio group, and a tert-butylthio group. Among these alkylthio groups, a methylthio group or an ethylthio group is preferred since suitable solubility in the ($C^1$) organic solvent can be attained, and a methylthio group is more preferred since the anticorrosive effect is further improved.

Specific examples of the case in which R represents a hydroxyalkyl group having 1 to 4 carbon atoms in the formula (4) include a hydroxymethyl group, a 2-hydroxyethyl group, a 1-hydroxyethyl group, a 3-hydroxy-n-propyl group, a 4-hydroxy-n-butyl group, and the like. Among these hydroxyalkyl groups, a hydroxymethyl group, a 2-hydroxyethyl group or a 1-hydroxyethyl group is preferred since suitable solubility in the ($C^1$) organic solvent can be attained, and a hydroxymethyl group is more preferred since the anticorrosive effect is further improved.

Specific examples of the case in which R represents a mercaptoalkyl group having 1 to 4 carbon atoms in the formula (4) include a mercaptomethyl group, a 2-mercaptoethyl group, a 1-mercaptoethyl group, a 3-mercapto-n-propyl group, a 4-mercapto-n-butyl group, and the like. Among these mercaptoalkyl groups, a mercaptomethyl group, a 2-mercaptoethyl group or a 1-mercaptoethyl group is preferred since suitable solubility in the ($C^1$) organic solvent can be attained, and a mercaptomethyl group is more preferred since the anticorrosive effect is further improved.

In the case in which R represents a halogenated alkyl group having 1 to 4 carbon atoms in the formula (4), examples of the halogen atom included in the halogenated alkyl group include fluorine, chlorine, bromine, iodine, and the like. Specific examples of the case in which R represents a halogenated alkyl group having 1 to 4 carbon atoms include a chloromethyl group, a bromomethyl group, an iodomethyl group, a fluoromethyl group, a dichloromethyl group, a dibromomethyl group, a difluoromethyl group, a trichloromethyl group, a tribromomethyl group, a trifluoromethyl group, a 2-chloroethyl group, a 2-bromoethyl group, a 2-fluoroethyl group, a 1,2-dichloroethyl group, a 2,2-difluoroethyl group, a 1-chloro-2-fluoroethyl group, a 3-chloro-n-propyl group, a 3-bromo-n-propyl group, a 3-fluoro-n-propyl group, a 4-chloro-n-butyl group, and the like. Among these halogenated alkyl groups, a chloromethyl group, a bromomethyl group, an iodomethyl group, a fluoromethyl group, a dichloromethyl group, a dibromomethyl group, a difluoromethyl group, a trichloromethyl group, a tribromomethyl group or a trifluoromethyl group is preferred, and a chloromethyl group, a dichloromethyl group, a trichloromethyl group or a trifluoromethyl group is more preferred since the anticorrosive effect is further improved.

Specific examples of the case in which R represents a halogen atom include fluorine, chlorine, bromine, and iodine.

In the formula (4), m is an integer of 1 to 3, and more preferably 1. Provided that m is 2 or 3, R may be the same or different.

In the compound represented by the formula (4), the position of substitution with R on the benzene ring is not particularly limited. Since a superior anticorrosive effect is likely to be achieved, the position of substitution with R on the benzene ring is preferably a meta- or para-position with respect to the position at which —$(CH_2)_n$—SH binds.

As the compound represented by the formula (4), due to superior anticorrosive properties for a metal such as copper, and superior stability in the cleaning liquid, a compound having at least one group selected from the group consisting of an alkyl group, a hydroxyalkyl group and a mercaptoalkyl group as R is preferred, and a compound having one group selected from the group consisting of an alkyl group, a hydroxyalkyl group and a mercaptoalkyl group as R is more preferred. In the case in which the compound represented by the formula (4) has one group selected from the group consisting of an alkyl group, a hydroxyalkyl group and a mercaptoalkyl group as R, the position of substitution with an alkyl group, a hydroxyalkyl group, or a mercaptoalkyl group on the benzene ring is preferably a meta- or para-position and more preferably a para-position with respect to the position at which $-(CH_2)_n-SH$ binds.

In the formula (4), n is an integer of 0 to 3. Due to ease in preparation and availability of the compound n is preferably 0 or 1, and more preferably 0.

Specific examples of the compound represented by the formula (4) include p-mercaptophenol, p-thiocresol, m-thiocresol, 4-(methylthio)benzenethiol, 4-methoxybenzenethiol, 3-methoxybenzenethiol, 4-ethoxybenzenethiol, 4-isopropyloxy benzenethiol, 4-tert-butoxybenzenethiol, 3,4-dimethoxy benzenethiol, 3,4,5-trimethoxybenzenethiol, 4-ethylbenzenethiol, 4-isopropyl benzenethiol, 4-n-butylbenzenethiol, 4-tert-butylbenzenethiol, 3-ethylbenzenethiol, 3-isopropyl benzenethiol, 3-n-butylbenzenethiol, 3-tert-butylbenzenethiol, 3,5-dimethyl benzenethiol, 3,4-dimethyl benzenethiol, 3-tert-butyl-4-methylbenzenethiol, 3-tert-4-methylbenzenethiol, 3-tert-butyl-5-methylbenzenethiol, 4-tert-butyl-3-methylbenzenethiol, 4-mercaptobenzyl alcohol, 3-mercaptobenzyl alcohol, 4-(mercaptomethyl)phenol, 3-(mercaptomethyl)phenol, 4-fluorobenzenethiol, 3-fluorobenzenethiol, 4-chlorobenzenethiol, 3-chlorobenzenethiol, 4-bromobenzenethiol, 4-iodobenzenethiol, 3-bromobenzenethiol, 3,4-dichlorobenzenethiol, 3,5-dichlorobenzenethiol, 3,4-difluorobenzenethiol, 3,5-difluorobenzenethiol, 4-mercaptocatechol, 2,6-di-tert-butyl-4-mercaptophenol, 3,5-di-tert-butyl-4-methoxybenzenethiol, 4-bromo-3-methylbenzenethiol, 4-(trifluoromethyl)benzenethiol, 3-(trifluoromethyl)benzenethiol, 3,5-bis(trifluoromethyl)benzenethiol, 4-methylthiobenzenethiol, 4-ethylthiobenzenethiol, 4-n-butylthiobenzenethiol, and 4-tert-butylthiobenzenethiol, and the like. Among these compounds, due to high anticorrosive effects on a metal such as copper, and favorable availability, p-mercaptophenol, p-thiocresol, m-thiocresol, 4-(methylthio)benzenethiol, 4-methoxybenzenethiol, 4-ethylbenzenethiol, 4-isopropyl benzenethiol, 4-fluorobenzenethiol, 4-chlorobenzenethiol, and 4-bromobenzenethiol are more preferred. In addition, due to high anticorrosive effects on a metal such as copper and superior stability in the cleaning liquid, 4-mercaptobenzyl alcohol and 4-(mercaptomethyl) phenol are also preferred.

In the formula (5), x is an integer of no less than 3, and the upper limit thereof is not particularly limited within the range not resulting in impairment of the object of the present invention. In light of the ability to favorably inhibit corrosion of a metal such as copper resulting from the cleaning liquid, x is preferably an integer of no less than 3 and no greater than 10, and more preferably an integer of no less than 3 and no greater than 9.

Suitable examples of the compound represented by the formula (5) include:

$HS-(CH_2)_3-OH$;

$HS-(CH_2)_4-OH$;

$HS-(CH_2)_5-OH$;

$HS-(CH_2)_6-OH$;

$HS-(CH_2)_7-OH$;

$HS-(CH_2)_8-OH$;

$HS-(CH_2)_9-OH$; and $HS-(CH_2)_{10}-OH$.

The content of the anticorrosive agent in the cleaning liquid is preferably 0.05 to 5.0% by mass, and more preferably 0.1 to 1.0% by mass with respect to the mass of the cleaning liquid.

Method for Production of Nonaqueous Cleaning Liquid

The method for production of the nonaqueous cleaning liquid according to the first aspect is not particularly limited. The nonaqueous cleaning liquid according to the first aspect can be prepared by mixing (A) a fluoroalkanol, (B) a quaternary ammonium salt, ($C^1$) an organic solvent and (D) other components, followed by uniformly dissolving the components.

The nonaqueous cleaning liquid according to the first aspect as described above is capable of removing both the fluorocarbon layer formed by the BOSCH method and the resist material, and the volatility loss of the cleaning liquid component when the cleaning liquid is used in the cleaning process is suppressed. Particularly, the nonaqueous cleaning liquid according to the first aspect can be advantageously used for cleaning of resist materials that can be developed with an aqueous alkali solution including negative and positive photoresists.

The nonaqueous cleaning liquid according to the first aspect may be used for a substrate having thereon a wiring or the like formed of a metal such as copper. In this case, for example, a previously known cleaning liquid formed by mixing aqueous hydrogen peroxide, a basic chemical liquid and water tends to corrode metals. On the other hand, the nonaqueous cleaning liquid according to the first aspect does not easily corrode metals as compared to a cleaning liquid formed by mixing aqueous hydrogen peroxide, a basic chemical liquid and water.

Nonaqueous Cleaning Liquid According to Second Aspect

A nonaqueous cleaning liquid according to a second aspect of the present invention is a nonaqueous cleaning liquid including: (A) a fluoroalkanol; and ($C^2$) an organic solvent, wherein the ($C^2$) organic solvent is a non-amine-based organic solvent which does not contain a fluorine atom. Hereinafter, the (A) fluoroalkanol, the ($C^2$) organic solvent and (D) other components will be described in order.

(A) Fluoroalkanol

The nonaqueous cleaning liquid according to the second aspect contains a fluoroalkanol similar to the (A) fluoroalkanol contained in the nonaqueous cleaning liquid according to the first aspect. The content of the (A) fluoroalkanol in the nonaqueous cleaning liquid according to the second aspect is similar to that in the nonaqueous cleaning liquid according to the first aspect.

($C^2$) Organic Solvent

The nonaqueous cleaning liquid according to the second aspect includes a non-amine-based organic solvent, which does not contain a fluorine atom, as a ($C^2$) organic solvent (hereinafter, also referred to as component ($C^2$)). The ($C^2$) organic solvent is not particularly limited unless the object of the present invention is hindered as long as the organic solvent is a non-amine-based organic solvent which does not contain a fluorine atom. Preferred examples of the non-amine-based organic solvent which does not contain a fluorine atom include glycols, glycol ethers and aprotic polar organic solvents which are suitably used as the ($C^1$) organic solvent in the nonaqueous cleaning liquid of the first aspect. Preferred specific examples of these organic solvents are similar to preferred specific examples of the ($C^1$) organic solvent. The ($C^2$) organic solvents may be used in a combination of two or more thereof. When two or more ($C^2$) organic solvents are used, it is preferred that an organic solvent selected from glycols and glycol ethers and an aprotic polar organic solvent are used in combination.

(D) Other Components

The nonaqueous cleaning liquid according to the second aspect may contain (D) other components contained in the nonaqueous cleaning liquid according to the first aspect as necessary.

Method for Production of Nonaqueous Cleaning Liquid

The method for production of the nonaqueous cleaning liquid according to the second aspect is not particularly limited. The nonaqueous cleaning liquid according to the second aspect can be prepared by mixing (A) a fluoroalkanol, ($C^2$) an organic solvent and (D) other components, followed by uniformly dissolving the components.

The nonaqueous cleaning liquid according to the second aspect as described above is capable of removing both the fluorocarbon layer formed by the BOSCH method and a resist material, and the volatility loss of the cleaning liquid component when the cleaning liquid is used in the cleaning process is suppressed. Particularly, the nonaqueous cleaning liquid according to the second aspect can be advantageously used for cleaning resist materials that can be developed with an organic solvent including negative and positive photoresists.

As in the case of the nonaqueous cleaning liquid according to the first aspect, the nonaqueous cleaning liquid according to the second aspect does not easily corrode metals as compared to a previously known cleaning liquid formed by mixing aqueous hydrogen peroxide, a basic chemical liquid and water.

Method for Etching processing According to Third Aspect

A third aspect of the present invention is a method for etching processing of a silicon substrate, and the method includes:

(A-I) an etching mask layer forming step of forming an etching mask layer having a predetermined pattern on a surface of a silicon substrate;

(A-II) a first etching step of etching the surface of the substrate uncovered by the etching mask layer;

(A-III) a recessed portion forming step of forming a recessed portion having a predetermined depth in the silicon substrate by repeating the steps (i) and (ii) a predetermined number of times:

(i) a fluorocarbon layer forming step of forming a fluorocarbon layer on the side wall and the bottom face of the recessed portion on the substrate surface, which is formed by etching, and (ii) a second etching step of etching the bottom face of the recessed portion; and (A-IV) a fluorocarbon layer removing step of removing the fluorocarbon layer with a cleaning liquid after forming the recessed portion having a predetermined depth. The nonaqueous cleaning liquid of the first aspect or the second aspect is used for removing the fluorocarbon layer.

Hereinafter, the method for etching processing according to the third aspect will be described with reference to FIGS. 1A to 1J.

(A-1) Etching Mask Layer Forming Step

Figure 1B:
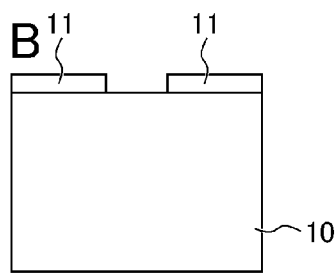
FIG. 1B is a view illustrating a silicon substrate including on a surface an etching mask layer having an opening with a predetermined pattern.

In the (A-I) etching mask layer forming step, an etching mask layer 11 having an opening having a predetermined pattern is formed on the surface of a silicon substrate 10 as illustrated in FIGS. 1A and 1B. The material of the etching mask layer 11 is not particularly limited. Preferred materials of the etching mask layer 11 may be various resist materials or inorganic silicon compounds such as $SiO_2$ and SiN. When the etching mask layer 11 is composed of a resist material, the etching mask layer 11 is formed by a previously known photolithography method. When the etching mask layer 11 is composed of an inorganic silicon compound, the etching mask layer can be formed by forming a thin film of an inorganic silicon compound on the surface of the silicon substrate, followed by forming on the thin film of the inorganic silicon compound a resist pattern having an opening at an area corresponding to the opening of the etching mask layer, peeling off the thin film of the inorganic silicon compound uncovered by the resist pattern by etching, and then removing the resist pattern.

After formation of a resist pattern having an opening at the area corresponding to the etching mask layer 11, the etching mask layer 11 can also be formed by a method for depositing an inorganic silicon compound in the opening of the resist pattern by a CVD method, and then removing the resist pattern.

In the (A-I) etching mask layer forming step, the etching mask layer 11 composed of a resist material can be removed using the nonaqueous cleaning liquid of the first or second aspect when the resist pattern composed of a resist material is used as the etching mask layer 11. At this time, the composition of the nonaqueous cleaning liquid is appropriately selected according to the type of the resist material.

(A-II) First Etching Step

Figure 1C:
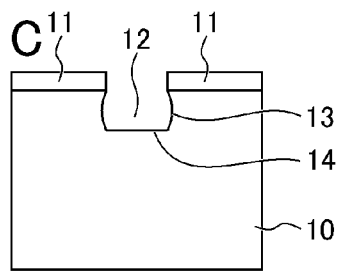
FIG. 1C is a view illustrating a silicon substrate including a recessed portion formed by a first etching step.

In the (A-II) first etching step, the surface of the silicon substrate uncovered by the etching mask layer 11 is etched to form a recessed portion 12 as illustrated in FIGS. 1B and 1C. In the first etching step, the method for etching the surface of the silicon substrate 10 uncovered by the etching mask layer 11 is not particularly limited. In the BOSCH method, normally etching of the silicon substrate 10 is performed by isotropic plasma etching using a $SF_6$ gas.

(A-III) Second Etching Step

Figure 1D:
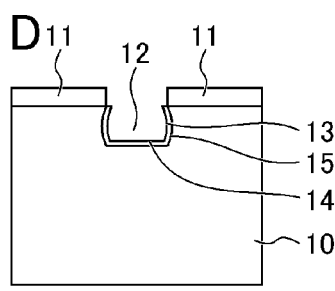
FIG. 1D is a view illustrating a silicon substrate including a recessed portion formed by the first etching step and having a fluorocarbon layer formed on the side wall and the bottom face in the recessed portion.
Figure 1E:
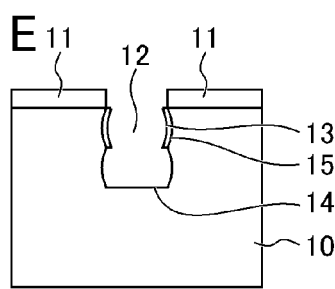
FIG. 1E is a view illustrating a silicon substrate in which the bottom face of the recessed portion including a fluorocarbon layer is excavated by a second etching step.

In the (A-III) recessed portion forming step, the recessed portion 12 having a predetermined depth is formed in the silicon substrate 10 by repeating, a predetermined number of times, (i) a fluorocarbon layer forming step of forming a fluorocarbon layer 15 on a side wall 13 and a bottom face 14 of the recessed portion 12 formed in the (A-II) first etching step, as illustrated in FIGS. 1C and 1D, and (ii) a second etching step of etching the bottom face 14 of the recessed portion 12, on which the fluorocarbon layer 15 is formed, as illustrated in FIGS. 1D and 1E.

In the (i) fluorocarbon layer forming step, the method for forming the fluorocarbon layer 15 on the inner surface of the recessed portion 12 is not particularly limited. In the BOSCH method, normally a $C_4F_8$ gas is passed into the recessed portion to perform plasma polymerization, thereby forming the fluorocarbon layer 15 on the inner surface of the recessed portion 12.

The etching method in the (ii) second etching step is not particularly limited. Normally in the (ii) second etching step, the bottom face 14 of the recessed portion 12 is etched by a method similar to that of the first etching step.

Figure 1F:
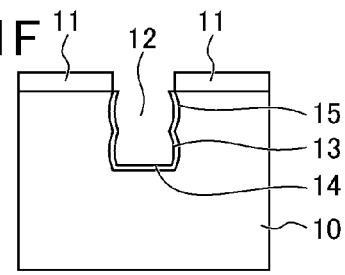
FIG. 1F is a view illustrating a silicon substrate including a recessed portion deepened by the second etching step, wherein a fluorocarbon layer is formed on the side wall and the bottom face in the recessed portion.
Figure 1G:
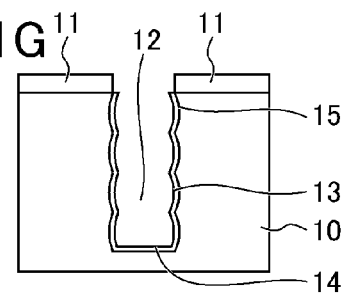
FIG. 1G is a view illustrating a silicon substrate including a recessed portion deepened to a predetermined depth by repetition etching and formation of a fluorocarbon layer, wherein the fluorocarbon layer is formed on the side wall and the bottom face in the recessed portion.

In the (A-III) recessed portion forming step, the deep recessed portion 12 can be formed without increasing the diameter of the recessed portion 12 by repeating, a predetermined number of times, the steps (i) and (ii) of forming the fluorocarbon layer on the side wall 13 of the recessed portion 12, so that the side wall 13 is not easily etched, followed by etching the bottom face 14 as illustrated in FIGS. 1E, 1F and 1G.

(A-IV) Fluorocarbon Layer Removing Step

Figure 1H:
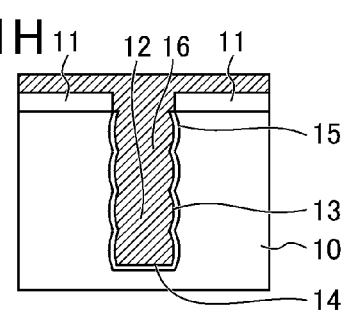
FIG. 1H is a view illustrating a step of removing the fluorocarbon layer formed on the side wall and the bottom face in a recessed portion deepened to a predetermined depth with a nonaqueous cleaning liquid of a first or second aspect.
Figure 1I:
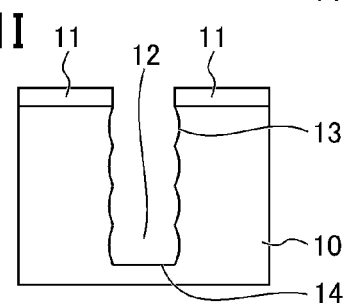
FIG. 1I is a view illustrating a silicon substrate including a recessed portion having a predetermined depth, which is freed of the fluorocarbon layer on the side wall and the bottom face, and an etching mask.

In the (A-IV) fluorocarbon layer removing step, the fluorocarbon layer 15 formed on the side wall 13 and the bottom face 14 of the recessed portion 12 is removed using a nonaqueous cleaning liquid 16 of the first or second aspect as illustrated in FIGS. 1G, 1H and 1I. The method for removing a fluorocarbon layer with the nonaqueous cleaning liquid 16 is not particularly limited, but is preferably a method in which the substrate 10 is immersed in the nonaqueous cleaning liquid 16 because the nonaqueous cleaning liquid 16 is easily brought into contact with the entire recessed portion 12.

Removal of the fluorocarbon layer 15 may be performed before or after removal of the etching mask layer 11. FIG. 1H illustrates an aspect in which the fluorocarbon layer 15 is removed before removal of the etching mask layer 11. When the etching mask layer 11 is composed of an inorganic silicon compound such as $SiO_2$ or SiN, for example, the etching mask layer 11 can be removed with a cleaning liquid containing hydrofluoric acid. When the etching mask layer 11 is composed of a resist material, the fluorocarbon layer 15 and the etching mask layer can be removed at the same time by using the nonaqueous cleaning liquid of the first or second aspect.

Figure 1J:
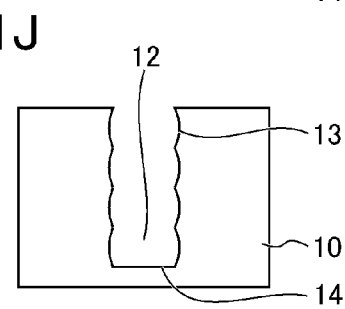
FIG. 1J is a view illustrating a silicon substrate which is freed of an etching mask layer and includes a recessed portion having a predetermined depth, which is freed of the fluorocarbon layer on the side wall and the bottom face.

By performing removal of the etching mask layer 11 and removal of the fluorocarbon layer 15 in the (A-IV) fluorocarbon layer removing step, the silicon substrate 10 including the recessed portion 12 having a predetermined depth as illustrated in FIG. 1J is obtained.

Method for Etching Processing According to Fourth Aspect

A fourth aspect of the present invention is a method for etching processing of a silicon substrate, and the method includes:

(B-I) a resist film forming step of forming a resist film by applying a resist composition to the surface of a silicon substrate;

(B-II) an etching mask layer forming step of forming an etching mask layer having predetermined pattern by exposing and developing the resist film;

(B-III) a first etching step of etching the surface of the substrate uncovered by the etching mask layer;

(B-IV) a recessed portion forming step of forming a recessed portion having a predetermined depth in the silicon substrate by repeating the steps (i) and (ii) a predetermined number of times:

(i) a fluorocarbon layer forming step of forming a fluorocarbon layer on the side wall and the bottom face of the recessed portion on the substrate surface, which is formed by etching, and (ii) a second etching step of etching the bottom face of the recessed portion;

(B-V) an etching mask layer removing step of removing the etching mask layer with a cleaning liquid after forming the recessed portion having a predetermined depth; and (B-VI) a fluorocarbon layer removing step of removing the fluorocarbon layer with a cleaning liquid after forming the recessed portion having a predetermined depth. The nonaqueous cleaning liquid of the first aspect or the second aspect is used for removing the etching mask layer and/or the fluorocarbon layer.

(B-I) Resist Film Forming Step and (B-II) Etching Mask Layer Forming Step

In the method for etching process according to the fourth aspect, an etching mask layer 11 is formed on the surface of a silicon substrate 10 using a resist material by the (B-I) resist film forming step and the (B-II) etching mask layer forming step. The method for forming the etching mask layer 11 using a resist material is not particularly limited, and is performed in accordance with a well-known photolithography method.

(B-III) First Etching Step

In the method for etching processing according to the fourth aspect, a recessed portion 12 is formed by etching the surface of the silicon substrate 10 uncovered by the etching mask layer 11 in the (B-III) first etching step in the same manner as in the (A-II) first etching step in the method for etching processing according to the third aspect.

(B-IV) Recessed Portion Forming Step

In the method for etching processing according to the fourth aspect, the recessed portion 12 having a predetermined depth is formed on the silicon substrate 10 by repeating, a predetermined number of times, (i) a fluorocarbon layer forming step of forming a fluorocarbon layer 15 on the side wall 13 and the bottom face 14 of the recessed portion 12 formed in the (B-III) first etching step, and (ii) a second etching step of etching the bottom face 14 of the recessed portion 12, on which the fluorocarbon layer 15 is formed, in the (B-IV) recessed portion forming step in the same manner as in the (A-III) recessed portion forming step in the method for etching processing according to the third aspect.

(B-V) Etching Mask Removing Step

In the method for etching processing according to the fourth aspect, the etching mask layer formed on the surface of the silicon substrate 10 and composed of a resist material is removed. The method for removing the etching mask layer 11 is not particularly limited, but is preferably a method for removing the layer with the nonaqueous cleaning liquid of the first or second aspect. When the etching mask layer 11 is removed with a nonaqueous cleaning liquid, the method thereof is not particularly limited, and is appropriately selected from well-known methods. Specific examples of the preferred method include an immersion method and a shower method.

(B-VI) Fluorocarbon Layer Removing Step

In the method for etching processing according to the fourth aspect, the fluorocarbon layer 15 formed on the side wall 13 and the bottom face 14 of the recessed portion 12 having a predetermined depth is removed. The method for removing the fluorocarbon layer 15 is not particularly limited, but is preferably a method for removing the layer with a nonaqueous cleaning liquid 16 of the first or second aspect. When the fluorocarbon layer 15 is removed with the nonaqueous cleaning liquid 16 of the first or second aspect, but this is preferably a method in which the substrate 10 is immersed in the nonaqueous cleaning liquid 16 because the nonaqueous cleaning liquid 16 is easily brought into contact with the entire recessed portion 12. The (B-V) etching mask removing step and the (B-VI) fluorocarbon layer removing step may be performed at the same time. For example, when the nonaqueous cleaning liquid 16 of the first or second aspect is used, the fluorocarbon layer 15 can be removed at the same time if the etching mask layer 11 is removed by the aforementioned immersion method.

In the (B-V) etching mask removing step and the (B-VI) fluorocarbon layer removing step, the nonaqueous cleaning liquid according to the first or second aspect is used in at least one of the steps, and preferably the nonaqueous cleaning liquid according to the first or second aspect is used in both the steps.

Method for Etching Processing According to Fifth Aspect

A fifth aspect of the present invention is a method for etching processing of a silicon substrate, and the method includes:

(C-I) an inorganic silicon compound film forming step of forming an inorganic silicon compound film on the surface of a silicon substrate;

(C-II) a resist film forming step of forming a resist film by applying a resist composition onto the inorganic silicon compound film;

(C-III) a resist pattern forming step of forming a resist pattern of a predetermined pattern by exposing and developing the resist film;

(C-IV) an etching mask layer forming step of forming an etching mask layer having predetermined pattern and composed of a silicon compound by etching a portion of the surface of the inorganic silicon compound film uncovered by the resist pattern, and thereafter removing the resist pattern with a cleaning liquid;

(C-V) a first etching step of etching the surface of the substrate uncovered by the etching mask layer;

(C-VI) a recessed portion forming step of forming a recessed portion having a predetermined depth in the silicon substrate by repeating the steps (i) and (ii) a predetermined number of times:

(i) a fluorocarbon layer forming step of forming a fluorocarbon layer on the side wall of the recessed portion on the substrate surface, which is formed by etching, and (ii) a second etching step of etching the bottom face of the recessed portion; and (C-VII) a fluorocarbon layer removing step of removing the fluorocarbon layer with a cleaning liquid after forming the recessed portion having a predetermined depth.

The nonaqueous cleaning liquid of the first aspect or the second aspect is used for removing the resist pattern and/or the fluorocarbon layer.

(C-I) Inorganic Silicon Compound Film Forming Step

In the method for etching processing according to the fifth aspect, an inorganic silicon compound film composed of $SiO_2$, SiN or the like as a material of the etching mask layer 11 is formed on the surface of a silicon substrate 10 in the (C-I) inorganic silicon compound film forming step. The method for forming an inorganic silicon compound film on the surface of the silicon substrate 10 is not particularly limited, and examples thereof include a CVD method.

(C-II) Resist Film Forming Step and (C-III) Resist Pattern Forming Step

In the (C-II) resist film forming step and the (C-III) resist pattern forming step, a resist pattern having an opening at the area corresponding to the opening of the etching mask layer 11 is formed on the inorganic silicon compound film in accordance with a well-known photolithography method.

(C-IV) Etching Mask Layer Forming Step

In the (C-IV) etching mask layer forming step, a portion of the surface of the inorganic silicon compound layer uncovered by the resist pattern formed in the (C-III) resist pattern forming step is etched, and the resist pattern is then removed. The method for removing the resist pattern is not particularly limited, but it is preferred to remove the resist pattern with the nonaqueous cleaning liquid according to the first or second aspect. When the resist pattern is removed with the nonaqueous cleaning liquid according to the first or second aspect, removal of the resist pattern is performed in the same manner as in the (B-V) etching mask removing step of the method for etching processing according to the fourth aspect.

(C-V) First Etching Step

In the method for etching processing according to the fifth aspect, the recessed portion 12 is formed by etching the surface of the silicon substrate 10 uncovered by the etching mask layer 11 in the (C-V) first etching step in the same manner as in the (A-II) first etching step in the method for etching processing according to the third aspect.

(C-VI) Recessed Portion Forming Step

In the method for etching processing according to the fifth aspect, the recessed portion 12 having a predetermined depth is formed in the silicon substrate 10 by repeating, a predetermined number of times, (i) a fluorocarbon layer forming step of forming a fluorocarbon layer 15 on the side wall 13 and the bottom face 14 of the recessed portion formed in the (C-V) first etching step, and (ii) a second etching step of etching the bottom face 14 of the recessed portion 12, on which the fluorocarbon layer 15 is formed, in the (C-VI) recessed portion forming step in the same manner as in the (A-III) recessed portion forming step in the method for etching processing according to the third aspect.

(C-VII) Fluorocarbon Layer Removing Step

In the method for etching processing according to the fifth aspect, the fluorocarbon layer 15 formed on the side wall 13 and the bottom face 14 of the recessed portion 12 having a predetermined depth is removed in the same manner as in the (B-VI) fluorocarbon layer removing step in the method for etching processing according to the fourth aspect. In the method for etching processing according to the fifth aspect, the etching mask layer 11 is removed in the same manner as in the method for etching processing according to the third aspect.

In the (C-IV) etching mask layer forming step and the (C-VII) fluorocarbon layer removing step, the nonaqueous cleaning liquid according to the first or second aspect is used in at least one of the steps, and preferably the nonaqueous cleaning liquid according to the first or second aspect is used in both the steps.

EXAMPLES

Hereinafter, the present invention will be explained in more detail by way of Examples, but the present invention is not limited to these Examples.

In Examples and Comparative Examples, those described below were used as (A) a fluoroalkanol (A-1 to A-5), (A') a fluorine-containing solvent (A-6 to A-10) which is a component analogous to the (A) fluoroalkanol, (B) a quaternary ammonium hydroxide and (C) an organic solvent. The compositions of the nonaqueous cleaning liquids are described in Tables 1 and 2. The contents of the components in Tables 1 and 2 are given in % by mass.

(A) Fluoroalkanol or (A') Fluorine-Containing Solvent
A-1: $H(CF_2)_2CH_2$—OH
A-2: $H(CF_2)_4CH_2$—OH
A-3: $H(CF_2)_6CH_2$—OH
A-4: $F(CF_2)_2CH_2$—OH
A-5: $F(CF_2)_4CH_2CH_2$—OH
A-6: $C_4F_9OCH_3$
A-7: $C_4F_9OC_2H_5$
A-8: $C_6F_{13}OCH_3$
A-9: F—$(CF_2CF_2O)_n$—$C_2F_5$ (mass average molecular weight: 2700)
A-10: $N(C_3F_7)_3$
(B) Quaternary Ammonium Hydroxide
Tetramethylammonium hydroxide
(C) Organic Solvent
PG: propylene glycol
SF: sulfolane
DMSO: dimethyl sulfoxide
NMP: N-methyl-2-pyrrolidone
NEP: N-ethyl-2-pyrrolidone Examples 1 to 14 and Comparative Examples 1 to 6

The nonaqueous cleaning liquids of Examples 1 to 14 and Comparative Examples 1 to 6 were prepared in accordance with the compositions described in Table 1. For the nonaqueous cleaning liquids of Examples 1 to 14 and Comparative Examples 1 to 6, fluorocarbon layer removal performance and resist material removal performance were checked in accordance with the method described below. The results of the following test are described in Table 1.

Fluorocarbon Layer Removal Test

In accordance with a usual method, a silicon substrate was etched by the BOSCH method, and a hole in which a fluorocarbon layer having a thickness of 100 nm was formed on the side wall was formed. The substrate in which the hole was formed was used as a test substrate for the fluorocarbon layer removal test. After a cleaning liquid was warmed to 80° C., a test substrate piece (2 cm×4 cm) was immersed in the warmed cleaning liquid for 30 minutes. After being immersed, the test substrate piece was taken out from the cleaning liquid, cleaned with isopropyl alcohol, and then cleaned with pure water. After the test substrate piece was cleaned with pure water, nitrogen gas was blown onto the substrate surface to remove water, and the test substrate piece was then placed on a hotplate at 100° C. to completely dry the test substrate piece.

The surface of the hole side wall of the dried test substrate was observed with a scanning electron microscope to evaluate performance of removal of the fluorocarbon layer by the cleaning liquid. A cleaning liquid was rated "Good" when the fluorocarbon layer was completely removed. A cleaning liquid was rated "Bad" when the fluorocarbon layer was not completely removed.

Resist Material removal Test

A resin represented by the following formula was used as a resin to be compounded with a resist composition. In the following formula, the lower right number of each unit is the number of parts by mass of each unit in 100 parts by mass of the resin. The mass average molecular weight of the resin represented by the following formula is 20000.

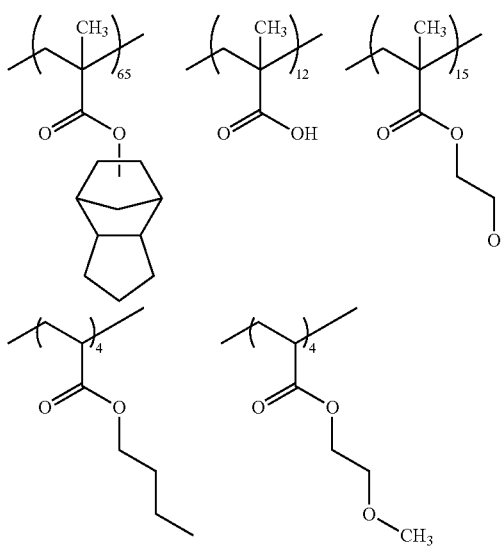

100 parts by mass of the resin represented by the above formula, 8 parts by mass of 2,2-dimethoxy-1,2-diphenylethane-1-one (photopolymerization initiator, trade name: Irgacure 651, manufactured by Ciba Japan K.K.), 4 parts by mass of a 2-(o-chlorophenyl)-4,5-diphenylimidazole dimer, 30 parts by mass of ethylene oxide-modified trimethylolpropane triacrylate (trade name: ARONIX M-350, manufactured by Toagosei Company, Limited), 10 parts by mass of polyethylene glycol diacrylate (trade name: NK Ester A-200, manufactured by SHIN-NAKAMULA CHEMICAL CO, LTD.), 10 parts by mass of N-vinylpyrrolidone (trade name: ARONIX M-150, manufactured by Toagosei Company, Limited) and 0.1 parts by mass of methyl hydroquinone (polymerization inhibitor) were dissolved in a mixed solvent of propylene glycol monomethyl ether acetate and methyl isobutyl ketone at a mass rate of 1:1 to obtain a resist composition.

A copper substrate of 2 cm×4 cm was used as a substrate. The resist composition was applied onto the substrate, and the substrate was then heated at 110° C. for 10 minutes to form a resist film having a film thickness of 40 μm. The formed resist film was exposed at an exposure amount of 1000 mJ/cm$^2$ using an exposure device: Canon PLA 501F Hardcontact (manufactured by Canon Inc.). A copper substrate having the resulting exposed resist film was used as a test substrate.

After a cleaning liquid was warmed to 60° C., a test substrate piece (2 cm×4 cm) was immersed in the warmed cleaning liquid for 15 minutes. After being immersed, the test substrate piece was taken out from the cleaning liquid, cleaned with isopropyl alcohol, and then cleaned with pure water. After the test substrate piece was cleaned with pure water, nitrogen gas was blown onto the substrate surface to remove water, and the test substrate piece was then placed on a hotplate at 100° C. to completely dry the test substrate piece.

The surface of the dried test substrate was observed with a scanning electron microscope to evaluate performance of removal of the resist material by the cleaning liquid. A cleaning liquid was rated "Good" when the resist material was completely removed. A cleaning liquid was rated "Bad" when the resist material was not completely removed.

TABLE 1

| | Component | | | | Fluorocarbon layer removal test | Resist material removal test |
|---|---|---|---|---|---|---|
| | A Type/Content | B Content | C-1 Type/Content | C-2 Type/Content | | |
| Example | | | | | | |
| 1 | A-5/3.0 | 2.0 | PG/11.0 | SF/84.0 | Good | Good |
| 2 | A-5/3.0 | 2.0 | PG/11.0 | DMSO/84.0 | Good | Good |
| 3 | A-5/3.0 | 2.0 | PG/11.0 | NMP/84.0 | Good | Good |
| 4 | A-5/3.0 | 2.0 | PG/11.0 | NEP/84.0 | Good | Good |
| 5 | A-1/3.0 | 2.0 | PG/10.0 | SF/85.0 | Good | Good |
| 6 | A-2/0.5 | 2.0 | PG/11.0 | SF/87.5 | Good | Good |
| 7 | A-2/1.0 | 2.0 | PG/1.0 | SF/87.0 | Good | Good |
| 8 | A-2/3.0 | 2.0 | PG/10.0 | SF/85.0 | Good | Good |
| 9 | A-2/3.0 | 2.0 | PG/10.0 | NMP/85.0 | Good | Good |
| 10 | A-2/3.0 | 2.0 | PG/10.0 | DMSO/85.0 | Good | Good |
| 11 | A-2/5.0 | 2.0 | PG/10.0 | SF/83.0 | Good | Good |
| 12 | A-3/3.0 | 2.0 | PG/10.0 | SF/85.0 | Good | Good |
| 13 | A-4/3.0 | 2.0 | PG/10.0 | SF/85.0 | Good | Good |
| 14 | A-5/3.0 | 2.0 | PG/10.0 | SF/85.0 | Good | Good |
| Comparative example | | | | | | |
| 1 | — | 2.0 | PG/11.0 | SF/87.0 | Bad | Good |
| 2 | A-9/3.0 | 2.0 | PG/11.0 | SF/84.0 | — | — |
| 3 | A-10/3.0 | 2.0 | PG/11.0 | SF/84.0 | — | — |
| 4 | A-6/3.0 | 2.0 | PG/10.0 | SF/85.0 | — | — |
| 5 | A-7/3.0 | 2.0 | PG/10.0 | SF/85.0 | — | — |
| 6 | A-8/3.0 | 2.0 | PG/10.0 | SF/85.0 | — | — |

According to Examples 1 to 14, it is apparent that a nonaqueous cleaning liquid including (A) a fluoroalkanol, (B) a quaternary ammonium hydroxide and (C) an organic solvent is capable of properly removing both the fluorocarbon layer and the resist material.

According to Comparative Example 1, it is apparent that when the nonaqueous cleaning liquid does not contain (A) a fluoroalkanol, it is difficult to remove the fluorocarbon layer.

In Comparative Examples 2 to 6, a nonaqueous cleaning liquid in which the components were uniformly dissolved could not be prepared. Therefore, in Comparative Examples 2 to 6, the fluorocarbon layer removal test and the resist material removal test were not conducted.

What is claimed is:

1. A nonaqueous cleaning liquid consisting of: (A) a fluoroalkanol; (B) a quaternary ammonium hydroxide; and ($C^1$) an organic solvent, or
(A) a fluoroalkanol; (B) a quaternary ammonium hydroxide; ($C^1$) an organic solvent and (D) a component selected from a surfactant and an anticorrosive agent, wherein the ($C^1$) organic solvent comprises an aprotic polar organic solvent, and an organic solvent selected from glycols and glycol ethers.

2. The nonaqueous cleaning liquid according to claim 1, wherein the (A) fluoroalkanol is a compound represented by the formula (1) or (2):

$$H(CF_2)_a CH_2-OH \quad (1)$$

$$F(CF_2)_b (CH_2)_c -OH \quad (2)$$

wherein a and b are each an integer of from 2 to 6, and c is an integer, 1 or 2.

3. The nonaqueous cleaning liquid according to claim 1, wherein the nonaqueous cleaning liquid is used for removal of a fluorocarbon layer.

4. The nonaqueous cleaning liquid according to claim 1, wherein the content of the (A) fluoroalkanol is 0.1 to 50% by mass.

5. A nonaqueous cleaning liquid consisting of: (A) a fluoroalkanol and ($C^2$) an organic solvent, or (A) a fluoroalkanol, ($C^2$) an organic solvent and (D) a component selected from a surfactant and an anticorrosive agent, wherein the ($C^2$) organic solvent is a non-amine-based organic solvent which does not contain a fluorine atom, and comprises an aprotic polar organic solvent, and an organic solvent selected from glycols and glycol ethers, and
wherein the surfactant is at least one selected from the group consisting of an amine-based surfactant substituted with an alkyl group or oxyalklyl group having at least 10 carbon atoms, an acetylene alcohol-based surfactant and a diphenyl ether-based surfactant substituted with at least one alkyl group having 7 or more carbon atoms.

6. The nonaqueous cleaning liquid according to claim 5, wherein the (A) fluoroalkanol is a compound represented by the formula (1) or (2):

$$H(CF_2)_a CH_2-OH \quad (1)$$

$$F(CF_2)_b (CH_2)_c -OH \quad (2)$$

wherein a and b are each an integer of from 2 to 6, and c is an integer, 1 or 2.

7. The nonaqueous cleaning liquid according to claim 5, wherein the nonaqueous cleaning liquid is used for removal of a fluorocarbon layer.

8. The nonaqueous cleaning liquid according to claim 5, wherein the content of the (A) fluoroalkanol is 0.1 to 50% by mass.

9. A method for etching processing of a silicon substrate, comprising:
forming an etching mask layer having a predetermined pattern on the surface of a silicon substrate;
etching the surface of the substrate uncovered by the etching mask layer;
forming a recessed portion having a predetermined depth in the silicon substrate by repeating (i) and (ii) below a predetermined number of times:
(i) forming a fluorocarbon layer on a side wall of a recessed portion on the substrate surface, which is formed by etching, and
(ii) etching the bottom face of the recessed portion; and
removing the fluorocarbon layer with the cleaning liquid according to claim 1 after forming the recessed portion having a predetermined depth.

10. A method for etching processing of a silicon substrate, comprising:
forming an etching mask layer on a surface of a silicon substrate having a predetermined pattern;
etching the surface of the substrate uncovered by the etching mask layer;
forming a recessed portion having a predetermined depth in the silicon substrate by repeating (i) and (ii) below a predetermined number of times:
(i) forming a fluorocarbon layer on a side wall of a recessed portion on the substrate surface, which is formed by etching, and
(ii) etching the bottom face of the recessed portion; and
removing the fluorocarbon layer with the cleaning liquid according to claim 6 after forming the recessed portion having a predetermined depth.

11. A method for etching processing of a silicon substrate, comprising:
forming a resist film by applying a resist composition to a surface of a silicon substrate;
forming an etching mask layer having predetermined pattern by exposing and developing the resist film;
etching the surface of the substrate uncovered by the etching mask layer;
forming a recessed portion having a predetermined depth in the silicon substrate by repeating (i) and (ii) below a predetermined number of times:
(i) forming a fluorocarbon layer on a side wall of a recessed portion on the substrate surface, which is formed by etching, and
(ii) etching a bottom face of the recessed portion;
removing the etching mask layer with a cleaning liquid after forming the recessed portion having a predetermined depth; and
removing the fluorocarbon layer with a cleaning liquid after forming the recessed portion having a predetermined depth, wherein the etching mask layer, the fluorocarbon layer, or the etching mask layer and the fluorocarbon layer are removed with the cleaning liquid according to claim 1.

12. A method for etching processing of a silicon substrate, comprising:
forming a resist film by applying a resist composition to a surface of a silicon substrate;
forming an etching mask layer having predetermined pattern by exposing and developing the resist film;
etching the surface of the substrate uncovered by the etching mask layer;
forming a recessed portion having a predetermined depth in the silicon substrate by repeating (i) and (ii) below a predetermined number of times:
(i) forming a fluorocarbon layer on a side wall of a recessed portion on the substrate surface, which is formed by etching, and
(ii) etching a bottom face of the recessed portion;

removing the etching mask layer with a cleaning liquid after forming the recessed portion having a predetermined depth; and removing the fluorocarbon layer with the cleaning liquid according to claim 5 after forming the recessed portion having a predetermined depth.

13. A method for etching processing of a silicon substrate, comprising:

forming an inorganic silicon compound film on the surface of a silicon substrate;

forming a resist film by applying a resist composition onto the inorganic silicon compound film;

forming a resist pattern of a predetermined pattern by exposing and developing the resist film;

forming an etching mask layer having a predetermined pattern and comprising a silicon compound by etching a portion of the surface of the inorganic silicon compound film on which is uncovered by the resist pattern, and thereafter removing the resist pattern with a cleaning liquid;

etching the surface of the substrate uncovered by the etching mask layer;

forming a recessed portion having a predetermined depth in the silicon substrate by repeating (i) and (ii) below a predetermined number of times:
  (i) forming a fluorocarbon layer on a side wall of a recessed portion on the substrate surface, which is formed by etching, and
  (ii) etching a bottom face of the recessed portion; and removing the fluorocarbon layer with a cleaning liquid after forming the recessed portion having a predetermined depth, wherein the resist pattern, the fluorocarbon layer or the resist pattern and the fluorocarbon layer are removed with the cleaning liquid according to claim 1.

14. A method for etching processing of a silicon substrate, comprising:

forming an inorganic silicon compound film on the surface of a silicon substrate;

forming a resist film by applying a resist composition onto the inorganic silicon compound film;

forming a resist pattern of a predetermined pattern by exposing and developing the resist film;

forming an etching mask layer having a predetermined pattern and comprising a silicon compound by etching a portion of the surface of the inorganic silicon compound film which is uncovered by the resist pattern, and thereafter removing the resist pattern with a cleaning liquid;

etching the surface of the substrate uncovered by the etching mask layer;

forming a recessed portion having a predetermined depth in the silicon substrate by repeating (i) and (ii) below a predetermined number of times:
  (i) forming a fluorocarbon layer on a side wall of a recessed portion on the substrate surface, which is formed by etching, and
  (ii) etching a bottom face of the recessed portion; and removing the fluorocarbon layer with a cleaning liquid after forming the recessed portion having a predetermined depth, wherein the resist pattern, the fluorocarbon layer or the resist pattern and the fluorocarbon layer are removed with the cleaning liquid according to claim 5.

\* \* \* \* \*